United States Patent
Fang

(10) Patent No.: US 7,432,751 B2
(45) Date of Patent: Oct. 7, 2008

(54) HIGH PERFORMANCE SIGNAL GENERATION

(75) Inventor: Xu Fang, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/430,663

(22) Filed: May 9, 2006

(65) Prior Publication Data

US 2006/0202733 A1    Sep. 14, 2006

Related U.S. Application Data

(62) Division of application No. 10/817,780, filed on Apr. 2, 2004, now Pat. No. 7,061,276.

(51) Int. Cl.
*H03L 7/00* (2006.01)
*H03B 10/00* (2006.01)

(52) U.S. Cl. .................... 327/156; 327/113; 327/107; 331/25

(58) Field of Classification Search ......... 327/156–159, 327/147–150, 1–3, 12, 105, 107, 113; 331/25
See application file for complete search history.

(56) References Cited

U.S. PATENT DOCUMENTS

| 4,090,145 | A | * | 5/1978 | Webb | 329/323 |
| 4,156,204 | A | * | 5/1979 | Hargis | 331/12 |
| 6,603,362 | B2 | * | 8/2003 | Von Dolteren, Jr. | 331/25 |
| 6,807,134 | B2 | * | 10/2004 | Nakajima et al. | 369/47.35 |

OTHER PUBLICATIONS

Danny Abramovitch, "Phase-Locked Loops: A Control Centric Tutorial," May 8, 2002, Communications and Research Lab, Agilent Labs.

* cited by examiner

*Primary Examiner*—Dinh T. Le
(74) *Attorney, Agent, or Firm*—Bruce D. Rubenstein

(57) ABSTRACT

A high performance phase detector includes a local digital oscillator for generating a digital reference signal of programmable frequency and phase. The phase detector accumulates a difference in phase between the digital reference signal and a sampled input signal to produce a measure of phase error. The phase detector can be advantageously used in a frequency synthesizer to produce signals with low phase noise and accurate phase control. Synthesizers of this type can further be used to as building blocks in ATE systems and other electronic systems for generating low jitter clocks and waveforms.

22 Claims, 5 Drawing Sheets

HIGH PERFORMANCE SIGNAL GENERATION

CROSS-REFERENCES TO RELATED APPLICATIONS

This application is a divisional of U.S. patent application Ser. No. 10/817,780, filed Apr. 2, 2004 now U.S. Pat. No. 7,061,276 and entitled "High Performance Signal Generation."

STATEMENT REGARDING FEDERALLY SPONSORED RESEARCH OR DEVELOPMENT

Not Applicable.

NAMES OF PARTIES TO A JOINT RESEARCH AGREEMENT

Not Applicable

REFERENCE TO A "SEQUENCE LISTING," A TABLE, OR A COMPUTER PROGRAM LISTING APPENDIX

Not Applicable.

BACKGROUND OF THE INVENTION

1. Field of the Invention

This invention relates generally to signal generation and more specifically to the synthesis of periodic signals with high signal integrity.

2. Description of Related Art

Automatic test equipment (ATE) and other high performance electronic systems rely upon the ability to generate precise periodic signals. ATE requires these signals for testing state-of-the-art electronic devices, such as computer chips, telecommunications chips, and electronic assemblies. As these devices and assemblies become more advanced, ATE must commensurately advance to maintain high testing standards.

FIG. 1 shows a conventional architecture 100 used by many ATE systems for synthesizing precise periodic signals. The architecture 100 includes a frequency generator 110, such as a DDS (direct digital synthesizer). The frequency generator 110 receives a programming value $F_{REF}$ and generates an analog signal having a frequency $F_{IN}$, which is proportional to $F_{REF}$. The signal having frequency $F_{IN}$ is then fed to one or more phase-locked loops 112-118. Each phase-locked loop 112-118 produces a respective output signal having a frequency $F_{OUT}$ that is proportional to $F_{IN}$. The architecture 100 thus provides a way of generating numerous signals of different frequencies, but which are all derived from a common frequency, $F_{IN}$.

FIG. 2 shows a conventional phase-locked loop 200, such as may be used in the architecture 100 of FIG. 1. The phase-locked loop 200 receives an input signal having a frequency $F_{IN}$ and generates an output signal having a frequency $F_{OUT}$. The phase-locked loop 200 is a feedback circuit having a forward path and a feedback path. The forward path includes a phase detector 210, a high gain loop filter 212, and a voltage-controlled oscillator (VCO) 214. The feedback path generally includes a first frequency divider 218. This divider in the feedback path has the effect of multiplying the output frequency. A second frequency divider 216 may optionally be provided outside the feedback loop for dividing the output frequency.

The phase detector 210 receives two input signals: the input signal at frequency $F_{IN}$ and a feedback signal at frequency $F_{OUT}/M$. As is known, the phase detector 210 includes circuitry for comparing the phase of its input signals to produce an output signal proportional to the difference in phase between its input signals. If properly stabilized, the action of the feedback loop drives this phase difference to zero. The loop filter 212 smoothes the output of the phase detector 210 and generally rolls off the gain of the loop to establish stability. The VCO 214 converts the output of the loop filter into a sinusoid to produce $F_{OUT}$. The first divider 218 (generally a counter) divides $F_{OUT}$ by M to produce the feedback signal. The second divider 216, if one is provided, divides $F_{OUT}$ by N. The overall closed loop frequency gain of the phase-locked loop 200 is therefore M/N.

We have recognized that the conventional architecture 100 for generating periodic signals can suffer from certain deficiencies. For instance, the phase-locked loop 200 introduces noise, which appears as timing jitter on synthesized output signals. The noise originates from several sources. For instance, the high-gain loop filter 212 introduces noise. It also amplifies noise generated internally and from other sources. The phase detector 210, VCO 214, first divider 218, and second divider 216 of the phase-locked loop 200 also add substantial noise.

Another problematic aspect of the conventional architecture 100 is that the divider 218 of the phase-locked loop 200 directly reduces the phase-locked loop's open loop gain. It is generally desirable for the divider ratio M to be large, to provide fine control over output frequency. However, the larger the value of M, the greater the reduction in open loop gain. As open loop gain is decreased, the accuracy and speed of the phase-locked loop 200 are correspondingly reduced.

It would be desirable to overcome these deficiencies.

BRIEF SUMMARY OF THE INVENTION

In accordance with the invention, a phase detector generates a digital phase error responsive to a difference in phase between a digitally synthesized reference signal and a sampled periodic signal.

According to an embodiment of the invention, the phase detector is used as a building block for constructing a frequency synthesizer, and the digitally synthesized reference signal is made variable to provide a wide range of output frequencies.

Frequency synthesizers employing the phase detector may be used in electronic systems, such as ATE, for generating periodic waveforms.

DETAILED DESCRIPTION OF THE INVENTION

Figure 1:
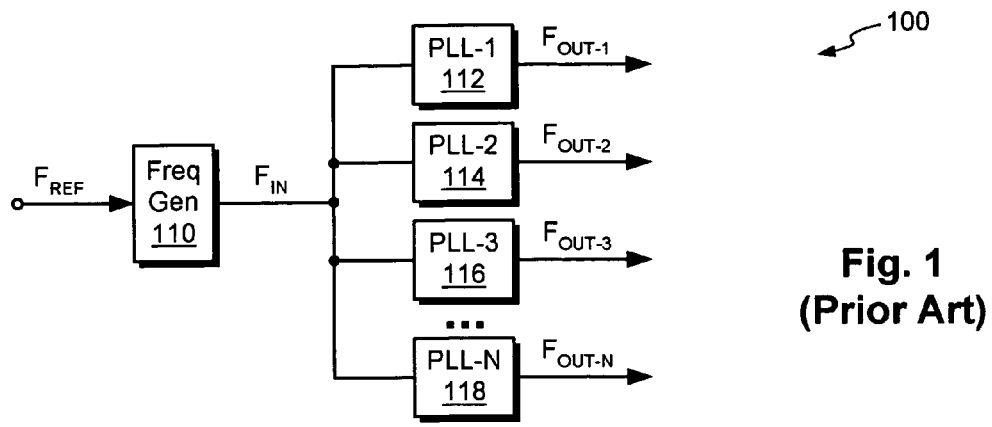
FIG. 1 is a block diagram of a circuit according to the prior art for generating signals of different frequencies using phase-locked loops.
Figure 2:
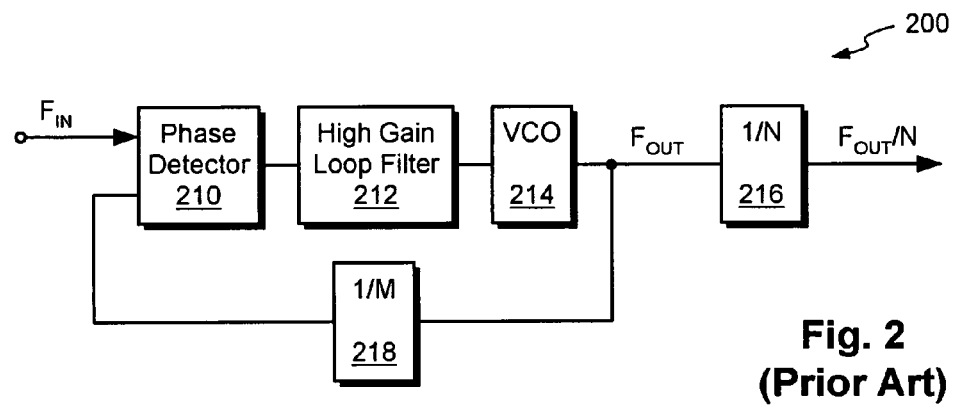
FIG. 2 is a block diagram of a phase-locked loop according to the prior art, such as may be used in connection with the circuit shown in FIG. 1.
Figure 3:
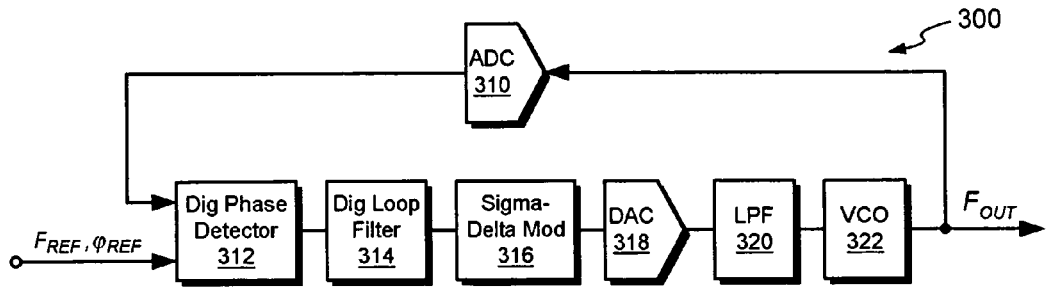
FIG. 3 is a block diagram of a frequency synthesizer in accordance with an illustrative embodiment of the invention.

FIG. 3 shows an illustrative embodiment of a frequency synthesizer 300 according to the invention. The synthesizer 300 has an input for receiving input data indicative of a frequency and phase ($F_{REF}$, $\phi REF$) The synthesizer 300 has an output for generating an output signal $F_{OUT}$. The frequency and phase of $F_{OUT}$ are determined by the input data.

In the illustrative embodiment of FIG. 3, the synthesizer 300 is a feedback circuit having a forward path and a feedback path. The forward path includes a digital phase detector 312, a digital loop filter 314, a sigma-delta modulator 316, a DAC (digital-to-analog converter) 318, an analog filter 320, and a VCO (voltage-controlled oscillator) 322. The feedback path includes an ADC (analog-to-digital converter) 310.

The digital phase detector 312 has a first input for receiving the input data ($F_{REF}$, $\phi REF$) and a second input for receiving a digital feedback signal. The digital phase detector 312 preferably generates a reference frequency having frequency $F_{REF}$ and phase $\phi REF$. The digital phase detector compares the reference signal with the feedback signal to generate a digital output signal indicative of the cumulative phase difference between the reference signal and the feedback signal. This is not unlike the manner in which a conventional phase detector produces a phase error proportional to a phase difference between its input signals.

The digital loop filter 314 preferably amplifies the digital output signal from the digital phase detector. The digital loop filter 314 also preferably provides filtering to limit the bandwidth of the feedback loop and reduce noise.

The sigma-delta modulator 316 is of a conventional type. It generates an output signal having a lesser number of bits than its input signal, but systematically adds content to its output signal at an elevated sampling rate to effectively regain the lost resolution.

The DAC 318 converts the signal at the output of the sigma-delta modulator 316 to a discrete analog signal, and the filter 320 smoothes the output of the DAC 318. This includes averaging the high frequency content added by the sigma-delta modulator 316. The filter 320 is preferably a low-pass filter. The filter preferably has a bandwidth that is much higher than the bandwidth of the feedback loop, so that it does not affect the stability of the feedback loop. The output of the filter 320 is fed to the input of the VCO 322, which generates $F_{OUT}$.

To close the feedback loop, the ADC 310 digitizes $F_{OUT}$ and passes the digitized signal (i.e., the feedback signal) back to the second input of the digital phase detector 312.

The frequency synthesizer 300 provides numerous advantages. Because the synthesizer 300 does not require a frequency divider (such as divider 218), an analog high-gain loop filter (such as 212), or an analog phase detector (such as 210), noise from these sources is avoided. In addition, the synthesizer 300 manages its signals in digital form up to the input of the DAC 318.

The DAC 318 and the ADC 310 add noise to the synthesizer 300. However, the amount of noise these elements add can be kept low through the use of accurate converters and by the filtering operation of the feedback loop.

The digital loop filter 314 is preferably programmable to selectively attenuate noise components. For example, if the ADC is known to generate a noise spur at 500 KHz, the digital loop filter 314 can be designed to have a gain of zero, or substantially zero, at 500 KHz, thus preventing the 500 KHz spur from appearing at the output of the synthesizer. Given the flexibility with which digital filters can be designed, particularly FIR (Finite Impulse Response) filters, frequency "zeroes" can be added to the transfer function of the digital loop filter 314 as needed for an arbitrary number of noise frequencies from any source. Preferably, the transfer function of the digital loop filter 314 is field programmable to accommodate particular noise characteristics of any target application.

The synthesizer 300 is preferably implemented on a circuit board assembly that includes a combination of digital and analog components. In the preferred embodiment, the digital phase detector 312, digital loop filter 314, and sigma-delta modulator 316 are provided together in a single digital component, such as an FPGA (Field Programmable Gate Array) or an ASIC (Application Specific Integrated Circuit). This is not required, however. Alternatively, they can be provided separately, or in the form of discrete logic. Some components can be provided in separate FPGAs, ASICs, or discrete logic, and others can be provided together. The digital phase detector 312, digital loop filter 314, and sigma-delta modulator 316 can also be implemented in software that runs on a computer processor.

The ADC 310 preferably has a resolution of at least 14 bits and a sampling rate of 100 MSa/s. This is not required, however. The type of converter (e.g., sigma-delta, successive approximation, etc.) is not critical to the invention. For synthesizers that are required to operate over only a narrow frequency range, the ADC 310 may be implemented as a bandpass sigma-delta converter. The DAC 318 preferably has a high resolution (e.g., 16-24 bits). Again, the type of converter is not critical to the invention.

Figure 4:
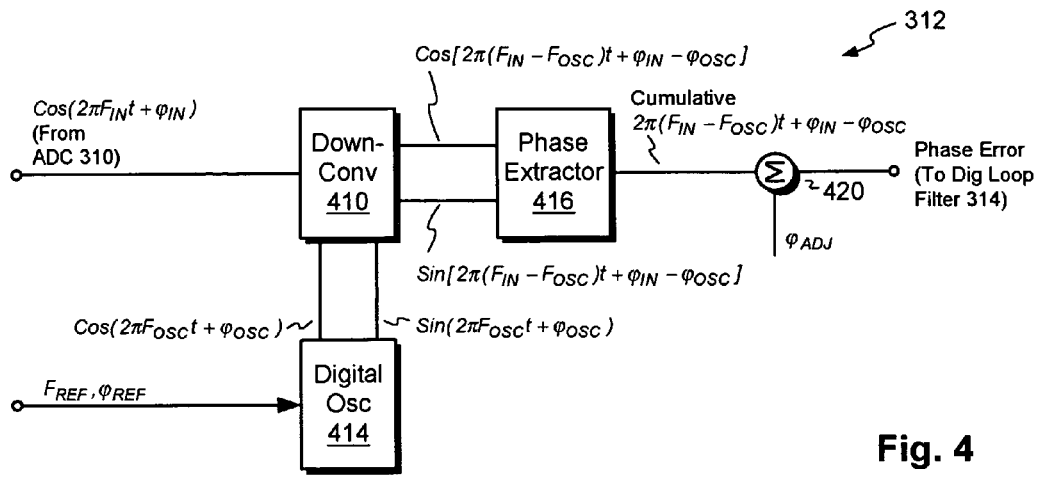
FIG. 4 is a block diagram of a digital phase detector in accordance with an illustrative embodiment of the invention, such as may be used in the frequency synthesizer shown in FIG. 3.

FIG. 4 shows a suitable digital phase detector for the synthesizer 300 according to an embodiment of the invention. As shown in FIG. 4, the first input of the digital phase detector is coupled to a digital oscillator 414, and the second input of the digital phase detector is coupled to a down-converter 410. Based upon the input data ($F_{REF}$, $\phi_{REF}$), the digital oscillator 414 synthesizes a digital reference signal having frequency a $F_{OSC}$ and a phase $\phi_{OSC}$. $F_{OSC}$ is preferably equal to $F_{REF}$, and $\phi_{OSC}$ is preferably equal to $\phi_{REF}$.

The digital reference signal is preferably a quadrature reference signal, i.e., it is provided in two parts that represent two sinusoids separated by a phase difference of 90-degrees. Conventionally, a first part of the quadrature reference signal is designated as a cosine and a second part is designated as a sine. Therefore, the first part of the quadrature reference signal has the form $\cos(2\pi F_{OSC}t+\phi_{OSC})$ and the second part has the form $\sin(2\pi F_{OSC}t+\phi_{OSC})$.

The quadrature reference signal is provided to the down-converter 510, whereupon it is mixed with the feedback signal. Taking the digital phase detector out of the context of the synthesizer 300, the feedback signal can be regarded more generally as a sampled periodic signal having the form $\cos(2\pi F_{IN}t+\phi_{IN})$.

The down-converter 410 produces a difference signal in response to the sampled periodic signal and quadrature reference signal. The difference signal is preferably a quadrature signal having two parts: one part having substantially the form $\cos[2\pi(F_{IN}-F_{OSC})t+\pi_{IN}-\pi_{OSC}]$, and the other part having substantially the form $\sin[2\pi(F_{IN}-F_{OSC})t+\phi_{IN}-\phi_{OSC}]$. Therefore, the frequency of the quadrature difference signal equals the difference between the input and oscillator frequencies, $F_{IN}-F_{OSC}$, and the phase of the quadrature difference signal equals the difference between the input and oscillator phases, $\phi_{IN}-\phi_{OSC}$.

Figure 6:
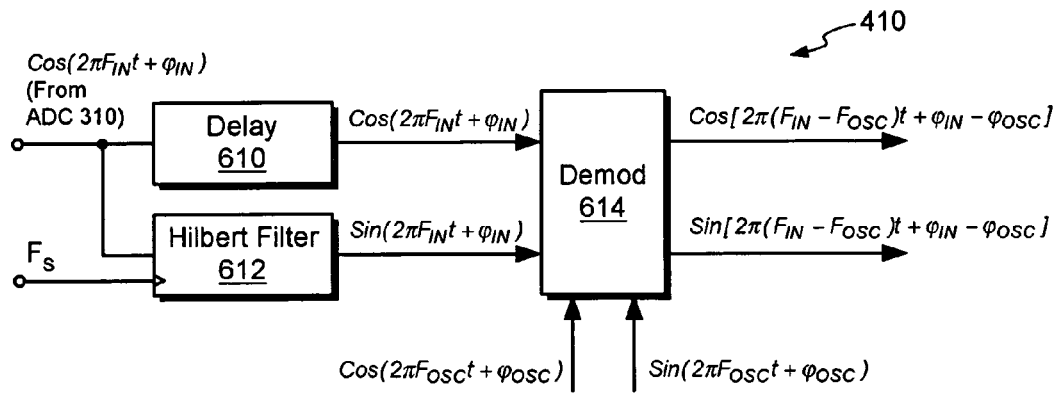
FIG. 6 is a block diagram of embodiment of a down-converter that may be used in the digital phase detector of FIGS. 4 and 5.
Figure 7:
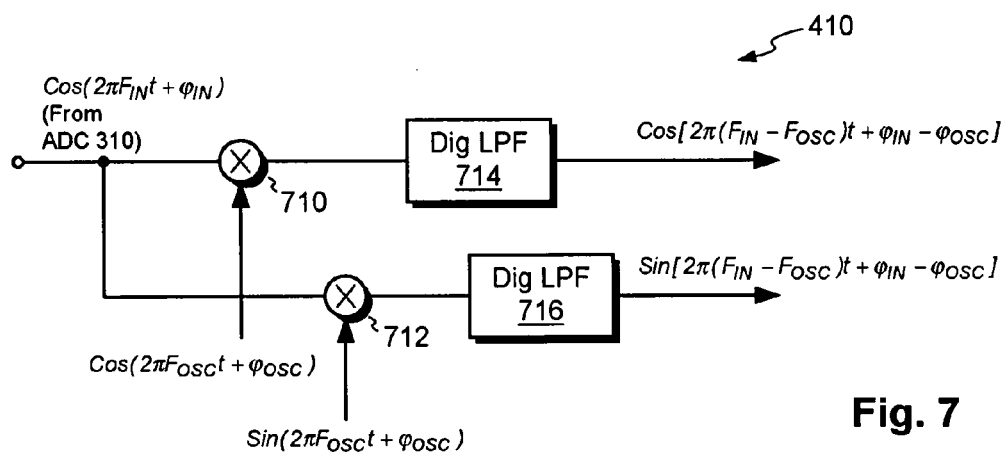
FIG. 7 is a block diagram of an alternative embodiment of a down-converter that may be used in the digital phase detector of FIGS. 4 and 5.

Turning briefly to FIGS. 6 and 7, two embodiments are shown of the down-converter 410. In FIG. 6, a Hilbert filter 612 generates a 90-degree phase-shifted version of the sampled periodic signal. A delay unit 610 accounts for any fixed propagation delay in the Hilbert filter 612. The output of the delay unit 610 and the output of the Hilbert filter 612 together form a quadrature version of the sampled periodic signal. A demodulator 614 demodulates the quadrature version of the sampled periodic signal with the quadrature reference signal to product the quadrature difference signal.

FIG. 7 shows a far simpler approach. The sampled periodic signal is respectively provided to first and second multipliers 710 and 712. The first multiplier 710 multiplies the sampled periodic signal by the first part of the quadrature reference signal, and the second multiplier 712 multiplies the sampled periodic signal by the second part of the quadrature reference signal. Each multiplication generates sum and difference components. First and second digital low-pass filters 714 and 716 respectively filter the outputs of the first and second multipliers 710 and 712 to remove the sum components and pass the difference components. These difference components form the quadrature difference signal.

Returning to FIG. 4, the quadrature difference signal is provided to a phase extractor 416. The phase extractor 416 generates a cumulative phase difference represented by the quadrature difference signal. In the preferred embodiment, the phase extractor 416 performs an ATAN2 function. As is known, ATAN2 generates a 4-quadrant inverse tangent of a quotient of two inputs. Where the two inputs to ATAN2 are a sine and a cosine of the same angle, $\theta$, ATAN2 $[\sin(\theta), \cos(\theta)]$ is simply the angle, $\theta$. Therefore, ATAN2 of the two parts of the quadrature difference signal evaluates to $[2\pi(F_{IN}-F_{OSC})t+\phi_{IN}-\phi_{OSC}]$. This value corresponds to the cumulative phase difference between the output of the digital oscillator 514 and the sampled periodic signal. If $F_{IN}$, $F_{OSC}$, $\phi_{IN}$ and $\phi_{OSC}$ are constant, the values described by the cumulative phase difference take the form of a straight line over time.

In the context of the synthesizer 300, the cumulative phase difference produced by the phase extractor 416 provides a digital phase error, which is not unlike the analog phase error generated by the analog phase detector 210 of the prior art. Optionally, a phase $\phi_{ADJ}$ may be added to or subtracted from the cumulative phase difference, via a summer 420, to adjust the phase error passed to other components of the synthesizer 300. Adding or subtracting phase via the summer 420 has the effect of shifting the phase of the synthesizer's output signal, $F_{OUT}$.

For the digital phase detector of FIG. 4 to perform properly, the digital oscillator 414 should be able to generate the quadrature reference signal with precision. For example, $F_{OSC}$ should substantially equal the frequency specified by $F_{REF}$ (nominally, $F_{OSC}$ and $F_{REF}$ are equal) and ($\phi_{OSC}$ must substantially equal the phase specified by ($\phi_{REF}$ (nominally, ($\phi_{OSC}$ and ($\phi_{REF}$ are equal). This requirement places significant demands on the digital oscillator 414, as it is required to produce precise values of the quadrature reference signal on the fly and at the requisite sampling rate.

This requirement can be achieved with relative ease if $F_{OSC}$ and $F_S$ are related, such that $K/F_{OSC}=L/F_S$, where K and L are both integers. In this case, the digital oscillator 414 can employ a look-up table for generating the quadrature reference signal. The look-up table associates pre-stored values of the quadrature reference signal with successive cycles of the sample clock. The digital oscillator can thus generate the quadrature reference signal simply by cycling through values stored its look-up table.

The situation becomes more complex, however, if $K/F_{OSC}$ does not equal $L/F_S$. Under this circumstance, a simple look-up table cannot be used because the values that are proper for one iteration through the look-up table become improper for other iterations. A different solution is required. One solution is to provide the digital oscillator 414 with a computing engine for calculating values of the quadrature reference signal on the fly and at speed. However, this solution is complex.

Figure 5:
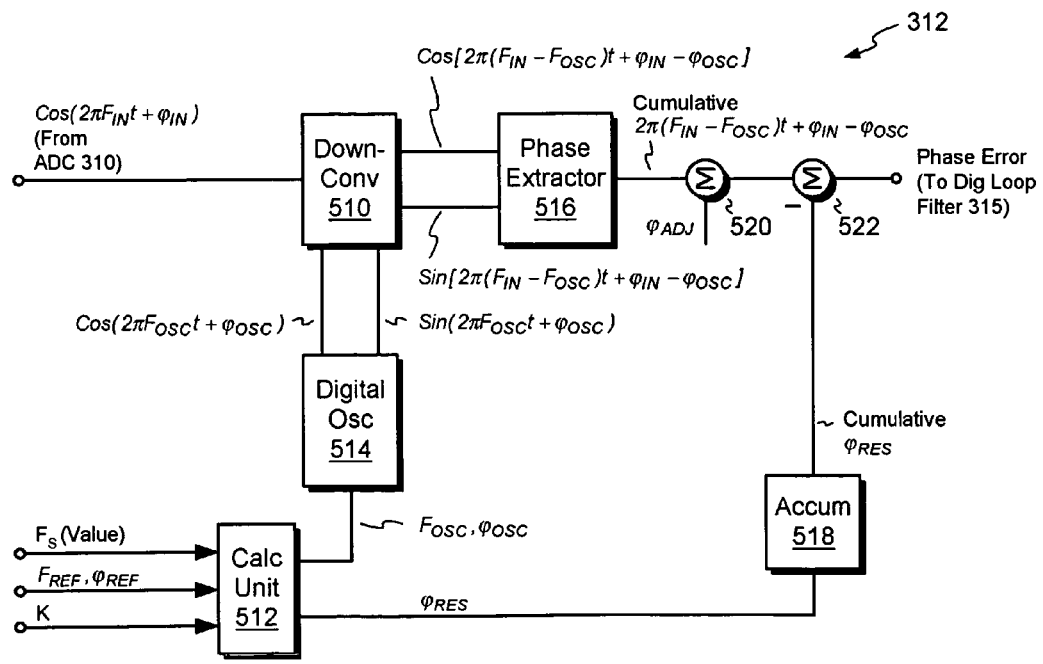
FIG. 5 is a block diagram of a digital phase detector in accordance with another illustrative embodiment of the invention.

Another solution is shown in FIG. 5, which shows an alternative embodiment of the digital phase detector 312. The down-converter 510, phase extractor 516, and summer 520 of FIG. 5 are substantially the same as the down-converter 410, phase extractor 416, and summer 420 of FIG. 4. However, FIG. 5 also includes a calculation unit 512, an accumulator 518, and a second summer 522.

The calculation unit 512 divides the input data ($F_{REF}$, $\phi_{REF}$) into two parts, a primary part and a secondary part. The primary part ($F_{OSC}$, $\phi_{OSC}$) represents an approximation of the reference signal ($F_{REF}$, $\phi_{REF}$) that the digital oscillator 514 can readily generate, such as by using a look-up table. The secondary part ($\phi_{RES}$) represents a residual phase value, i.e., the error in the above approximation. The primary part preferably meets the requirement that $K/F_{OSC}=L/F_S$. If $F_{OSC}$ does not equal $F_{REF}$, then as a matter of convention K and L are preferably selected such that $F_{OSC}$ is slightly greater than $F_{REF}$. Therefore, the secondary part, ($\phi_{RES}$, represents the phase difference between $F_{OSC}$ and $F_{REF}$ that accrues over each cycle of $F_S$.

The accumulator 518 accumulates (i.e., adds to its own contents) values of $\phi_{RES}$ on each cycle of $F_S$. The values held by the accumulator 518, when viewed over time, thus take the form of a straight line.

The output of the phase extractor 516 does not account for the secondary part of the input data. The summer 522 corrects this output by subtracting the output of the accumulator 518 from the output of the phase extractor 516. The output of the summer 522 thus accounts for both the primary and secondary parts of the input data, and produces an accurate representation of phase error between the sampled periodic signal and the reference (i.e., $F_{REF}$, ($\phi_{REF}$).

The general implementations of the digital phase detectors of FIGS. 4 and 5 have been described above in connection with FIG. 3. Certain elements, such as the ATAN2 function and the accumulator 518, have logic definitions that are commercially available. These definitions may be purchased, downloaded, and embodied in an FPGA or ASIC with little original design work.

The reference data ($F_{REF}$, $\phi_{REF}$) is preferably variable. When the digital phase detector of FIGS. 4 or 5 is used in a synthesizer, the reference data is preferably programmable for establishing different output frequencies. The values of the integers K and L are preferably updated each time a new value of reference data is programmed. To minimize the size of the residue, K is preferably made as large as practicable. K and L may be computed manually, or may be generated by software, firmware, or hardware based upon the desired output frequency and the sampling rate.

The digital phase detectors of FIGS. 4 and 5 offer many benefits. For example, phase error is updated at a high frequency, such as once per cycle of the sample clock. In addition, phase error is provided with exceedingly high resolution. Because the phase residue, $\phi_{RES}$, is managed independently of the primary part of the reference frequency, a large number of bits of numerical precision can be applied to $\phi_{RES}$. Also, the contribution of $\phi_{RES}$ to the overall phase error can be made exceedingly small by increasing the number of cycles of $F_{OSC}$ (i.e., the value of K) that are stored in the look-up table used to implement the digital oscillator 514.

Figure 8:
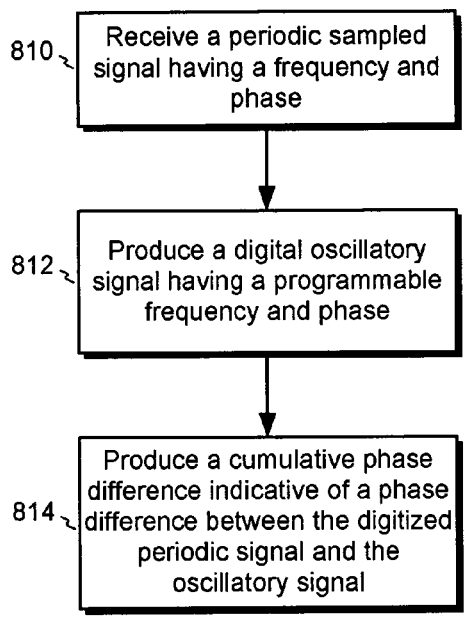
FIG. 8 is a flow chart showing a process according to an embodiment of the invention for generating a cumulative phase error between a digitized input signal and a reference frequency.

FIG. 8 shows a process according to an embodiment of the invention for measuring a cumulative phase difference between a periodic sampled signal and a digital oscillatory reference signal. By way of example, both the digital phase detector of FIG. 4 and the digital phase detector of FIG. 5 can be arranged to conduct this process.

Figure 9:
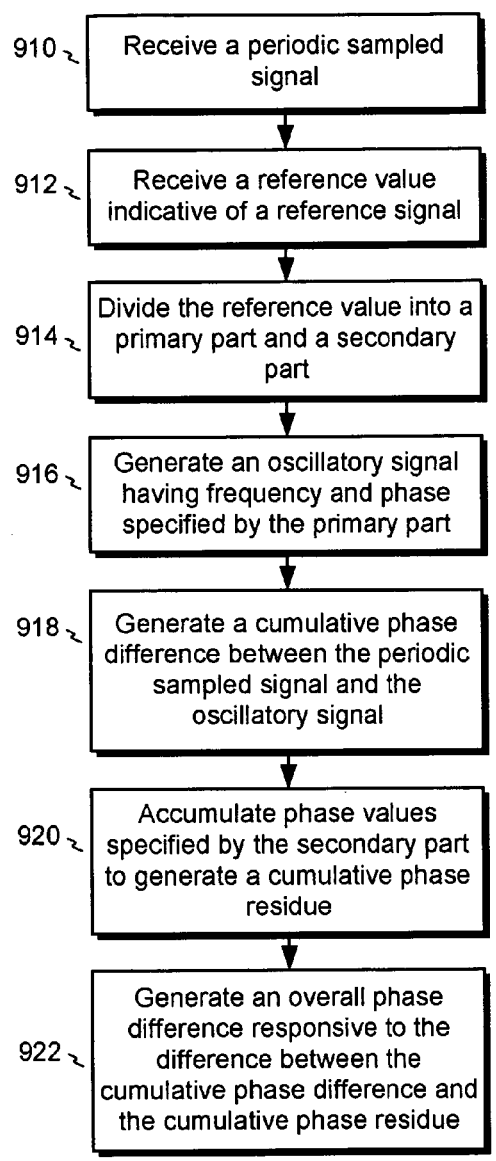
FIG. 9 is a flow chart showing a process according to an alternative embodiment of the invention for generating a cumulative phase error between a digitized input signal and a reference frequency.

FIG. 9 shows a process according to another embodiment of the invention for measuring a cumulative phase difference between a periodic sampled signal and a digital oscillatory reference signal. By way of example, the digital phase detector of FIG. 5 can be arranged to conduct this process.

Figure 10:
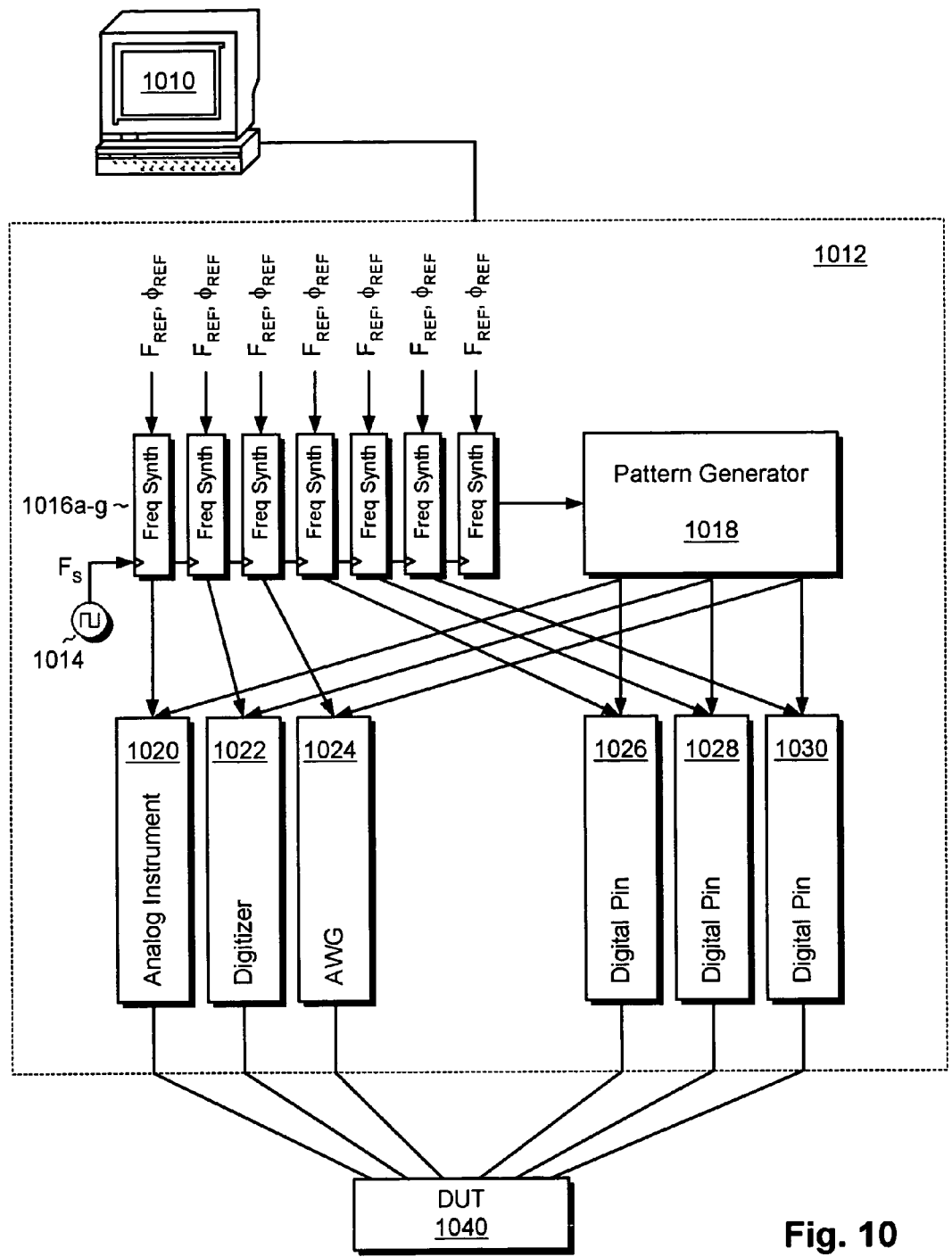
FIG. 10 is simplified block diagram of an automatic test system according to an embodiment of the invention, wherein frequency synthesizers such as those shown in FIG. 3 may be employed to improve signal integrity.

FIG. 10 shows an application of frequency synthesizers of the type shown in FIG. 3. An automatic test system 1012 is controlled by a host computer 1010 for testing a DUT (device under test) 1040. The automatic test system 1012 includes instruments, such as an analog instrument 1020, a digitizer 1022, and an arbitrary waveform generator (AWG) 1024. The automatic test system 1012 may also include a plurality of digital electronic channels, shown generally as digital pins 1026, 1028, and 1030. The digital electronic channels are arranged for sourcing and sensing digital signals.

Notably, the automatic test system 1012 includes a plurality of frequency synthesizers 1016a-g. These synthesizers are of the same general type as that shown in FIG. 3. The synthesizers 1016a-g each receive a clock signal, $F_S$, from a system clock 1014. They also each receive respective input data ($F_{REF}$, $\phi_{REF}$) for specifying desired output frequencies and phases. In response to their clock and respective input data, the frequency synthesizers 1016a-g each generate a respective periodic output signal. These output signals can be provided to the instruments 1020, 1022, and 1024, which may require frequency references or clocks for their normal operation. The output signals can also be used as clocks for controlling the digital pins 1026, 1028, and 1030. A frequency synthesizer can be used as input to a pattern generator 1018. The pattern generator 1018 can work in conjunction with frequency synthesizers for causing the digital pins to source and/or sense digital signals with specified formatting and at precisely controlled instants of time.

The embodiments disclosed herein may be varied within the scope of the invention. For example, the digital phase detectors shown in FIGS. 4 and 5 have been shown and described for use in connection with frequency synthesizers, such as the one shown in FIG. 3. Alternatively, however, these digital phase detectors may be used in any application to measure a phase difference between an input signal and a reference.

As shown and described, the synthesizer of FIG. 3 includes a digital loop filter 314. Alternatively, an analog loop filter, similar to the filter 212, may be inserted at the output of the DAC 318, and the digital loop filter 314 may be omitted.

As shown and described, the synthesizer 300 includes a sigma-delta modulator 316. Alternatively, however, the sigma-delta modulator may be omitted.

As used herein, the words "comprising," "having," and "including," as well as grammatical variations of these words, do not signal closed groups of elements, but rather open-ended groups that may contain additional elements. In addition, the word "coupling" and grammatical variations thereof do not require a direct connection between elements, but designate connections that may be direct or indirect. Therefore, elements may be connected between elements that are "coupled" together.

The embodiments disclosed herein involve the use of digital electronics for performing mathematical functions. Owing to the flexibility of mathematics, different mathematical operations or combinations may be used for achieving substantially the same results as are achieved herein in equivalent ways. These variations are intended to fall within the scope of the invention.

Therefore, the embodiments disclosed herein should not be construed as limiting.

What is claimed is:

1. A circuit for generating a periodic waveform, comprising:
    a digital phase detector having an input for receiving a multi-bit, discrete-time sampled feedback signal and an output for providing a digital phase error signal indicative of a difference in phase between the multi-bit, discrete-time sampled feedback signal and a digital oscillatory signal;
    a digital loop filter having an input and an output, the input coupled to the output of the digital phase detector;
    a VCO having an input and an output, the input coupled to the output of the loop filter; and
    an ADC having an input and an output, the input coupled to the output of the VCO and the output coupled to the input of the digital phase detector for providing the multi-bit, discrete-time sampled feedback signal,
    wherein the digital phase detector includes
        a digital oscillator for generating the digital oscillatory signal,
        a down converter having a first input for receiving the digital oscillatory signal, a second input for receiving the multi-bit, discrete-time sampled feedback signal, and an output,
        a phase extractor, having an input coupled to the output of the down converter and an output coupled to the output of the digital phase detector, and
        a summer coupled in series between the output of the phase extractor and the output of the digital phase detector for effecting an adjustment to the digital phase error signal by a desired, predetermined amount.

2. A circuit as recited in claim 1, wherein the digital oscillator is programmable for providing the digital oscillatory signal at different frequencies.

3. A circuit as recited in claim 2, wherein the digital oscillator is further programmable for providing the digital oscillatory signal at different phases.

4. A circuit as recited in claim 1, wherein the adjustment to the digital phase error signal is programmable.

5. A circuit as recited in claim 1, wherein the digital loop filter is a Finite Impulse Response (FIR) filter.

6. A circuit as recited in claim 1, wherein the digital loop filter has a transfer function that is field programmable to accommodate particular noise characteristics of a target application.

7. A circuit as recited in claim 1, further comprising a DAC coupled in series between the output of the loop filter and the input of the VCO.

8. A circuit for generating a periodic waveform, comprising:
   a digital phase detector having an input for receiving a multi-bit, discrete-time sampled feedback signal and an output for providing a digital phase error signal indicative of a difference in phase between the multi-bit, discrete-time sampled feedback signal and a digital oscillatory signal;
   a digital loop filter having an input and an output, the input coupled to the output of the digital phase detector;
   a sigma-delta modulator having an input and an output, the input coupled to the output of the digital loop filter;
   a DAC having an input and an output, the input coupled to the output of the sigma-delta modulator;
   a VCO having an input and an output, the input coupled to the output of the loop filter; and
   an ADC having an input and an output, the input coupled to the output of the VCO and the output coupled to the input of the digital phase detector for providing the multi-bit, discrete-time sampled feedback signal,
   wherein the digital phase detector includes
   a down converter having a first input for receiving the digital oscillatory signal, a second input for receiving the multi-bit, discrete-time sampled feedback signal, and an output, and
   a phase extractor, having an input coupled to the output of the down converter and an output coupled to the output of the digital phase detector.

9. A circuit as recited in claim 8, further comprising an analog filter coupled in series between the DAC and the VCO.

10. A method of generating a periodic signal, comprising:
   (A) receiving an oscillatory digital signal;
   (B) receiving a multi-bit, discrete-time sampled feedback signal;
   (C) generating a digital phase error signal responsive to a difference in phase between the oscillatory digital signal and the multi-bit, discrete-time sampled feedback signal;
   (D) adjusting the digital phase error by adding to or subtracting from the digital phase error signal;
   (E) filtering the adjusted digital phase error;
   (F) converting the filtered adjusted digital phase error into an oscillatory analog signal; and
   (G) sampling the oscillatory analog signal to produce the multi-bit, discrete-time sampled feedback signal,
   wherein the step of generating the digital phase error signal includes
   generating a difference signal having a frequency equal to a difference in frequency between the oscillatory digital signal and the multi-bit, discrete-time sampled feedback signal and having a phase equal to a difference in phase between the oscillatory digital signal and the multi-bit, discrete-time sampled feedback signal; and
   extracting a cumulative phase error from the difference signal.

11. A method as recited in claim 10, wherein the step (F) of converting the filtered adjusted digital phase error into the oscillatory analog signal comprises:
   converting the filtered adjusted digital phase error into a first analog signal having a level; and
   converting the first analog signal into the oscillatory analog signal,
   wherein the oscillatory analog signal has a frequency that varies in relation with the level of the first analog signal.

12. A method as recited in claim 10, wherein the step (E) of filtering comprises digitally filtering the adjusted digital phase error.

13. A circuit for generating a periodic waveform, comprising:
   a down converter having a first input for receiving a digital oscillatory signal, a second input for receiving a feedback signal, and an output for providing a digital difference signal;
   a phase extractor, having an input and an output, the input coupled to the output of the down converter;
   a loop filter having an input and an output, the input coupled to the output of the phase extractor;
   a VCO having an input and an output, the input coupled to the output of the loop filter;
   an ADC having an input and an output, the input coupled to the output of the VCO and the output coupled to the second input of the down converter for providing the feedback signal; and
   a summer, coupled between the output of the phase extractor and the input of the loop filter, for adding or subtracting a desired phase adjustment.

14. A circuit as recited in claim 13, further comprising a digital oscillator for generating the digital oscillatory signal.

15. A circuit for generating a periodic waveform, comprising:
   a calculation unit having an input, a first output, and a second output, the input for receiving a signal indicative of a desired frequency of the periodic waveform;
   a digital oscillator having an input and an output, the input coupled to the first output of the calculation unit;
   a downconverter having a first input, a second input, and an output, the first input coupled to the output of the digital oscillator;
   a phase extractor, having an input and an output, the input coupled to the output of the down converter;
   a summer having a first input, a second input, and an output, the first input coupled to the output of the phase extractor and the second input coupled to the second output of the calculation unit;
   a VCO having an input and an output, the input coupled to the output of the summer; and
   an ADC having an input and an output, the input coupled to the output of the VCO and the output coupled to the second input of the downconverter.

16. A circuit as recited in claim 15, further comprising a loop filter coupled in series between the summer and the VCO.

17. A circuit as recited in claim 15, further comprising an accumulator coupled in series between the second output of the calculation unit and the summer.

18. A circuit as recited in claim 15, further comprising another summer, coupled in series between the output of the phase extractor and the input of the loop filter, for effecting a phase adjustment by a desired, predetermined amount.

19. A circuit for generating a periodic waveform, comprising:
- a digital oscillator having an input and an output, the input for receiving a signal indicative of a desired frequency of the periodic waveform;
- a demodulator having a first input, a second input, a third input, and an output, the first input coupled to the output of the digital oscillator;
- a Hilbert filter having an input and an output, the input coupled to the second input of the demodulator and the output coupled to the third input of the demodulator;
- a phase extractor, having an input and an output, the input coupled to the output of the down converter;
- a VCO having an input and an output, the input coupled to the output of the phase extractor; and
- an ADC having an input and an output, the input coupled to the output of the VCO and the output coupled to the second input of the demodulator.

20. A method of generating a periodic signal, comprising:
- (A) calculating, responsive to an input indicative of a desired frequency of the periodic signal, a primary part and a secondary part;
- (B) generating an oscillatory digital signal responsive to the primary part;
- (C) generating a residue signal responsive to the secondary part;
- (D) generating an error signal responsive to a difference between the oscillatory digital signal and a digital feedback signal;
- (E) adjusting the error signal responsive to the residue signal;
- (F) converting the adjusted error signal into an oscillatory analog signal; and
- (G) sampling the oscillatory analog signal to produce the digital feedback signal.

21. A circuit as recited in claim 20, further comprising, prior to the step (F) of converting, digitally filtering the adjusted error signal.

22. A method as recited in claim 20, wherein the step of generating the oscillatory digital signal comprises accessing a look-up table that stores digital values of the oscillatory digital signal.

* * * * *

UNITED STATES PATENT AND TRADEMARK OFFICE
CERTIFICATE OF CORRECTION

PATENT NO. : 7,432,751 B2 Page 1 of 1
APPLICATION NO. : 11/430663
DATED : October 7, 2008
INVENTOR(S) : Xu It is certified that error appears in the above-identified patent and that said Letters Patent is hereby corrected as shown below:

Title Page: Item (12) delete "Fang" and insert --Xu--.

Title Page: Item (75) Inventors: please replace the inventor name "Xu Fang" with --Fang Xu--.

Signed and Sealed this

Thirty-first Day of August, 2010

David J. Kappos
*Director of the United States Patent and Trademark Office*

(12) EX PARTE REEXAMINATION CERTIFICATE (7612th)
United States Patent
Fang

(10) Number: US 7,432,751 C1
(45) Certificate Issued: Jul. 13, 2010

(54) HIGH PERFORMANCE SIGNAL GENERATION

(75) Inventor: Xu Fang, Newton, MA (US)

(73) Assignee: Teradyne, Inc., North Reading, MA (US)

Reexamination Request:
No. 90/010,621, Jul. 28, 2009

Reexamination Certificate for:
Patent No.: 7,432,751
Issued: Oct. 7, 2008
Appl. No.: 11/430,663
Filed: May 9, 2006

Related U.S. Application Data

(62) Division of application No. 10/817,780, filed on Apr. 2, 2004, now Pat. No. 7,061,276.

(51) Int. Cl.
*H03L 7/00* (2006.01)
*H03B 10/00* (2006.01)

(52) U.S. Cl. .................. 327/156; 327/113; 327/107; 331/25

(58) Field of Classification Search .................. None
See application file for complete search history.

(56) References Cited

U.S. PATENT DOCUMENTS

| 6,252,464 | B1 | 6/2001 | Richards et al. |
| 2002/0084856 | A1 | 7/2002 | Von Dolteren, Jr. |

*Primary Examiner*—My-Trang Ton

(57) ABSTRACT

A high performance phase detector includes a local digital oscillator for generating a digital reference signal of programmable frequency and phase. The phase detector accumulates a difference in phase between the digital reference signal and a sampled input signal to produce a measure of phase error. The phase detector can be advantageously used in a frequency synthesizer to produce signals with low phase noise and accurate phase control. Synthesizers of this type can further be used to as building blocks in ATE systems and other electronic systems for generating low jitter clocks and waveforms.

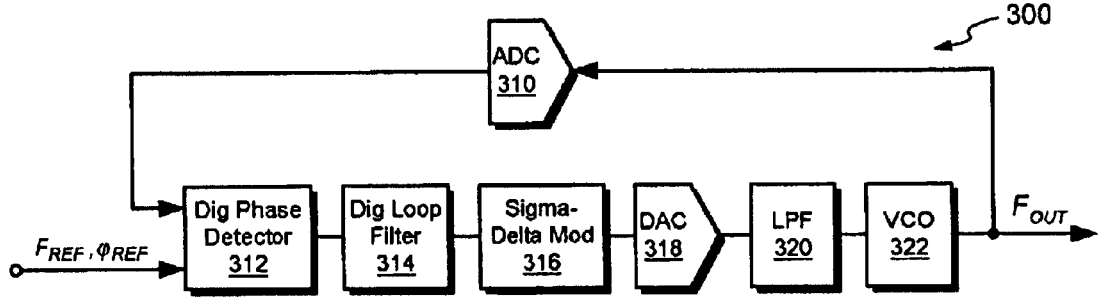

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-14 is confirmed.

Claims 15-22 were not reexamined.

* * * * *